INTEGRATED SOLID STATE SCANNING DEVICE

Filed Nov. 29, 1963 2 Sheets-Sheet 1

INVENTOR.
Evan L. Ragland III
BY
Mueller & Aichele
Attys.

Sept. 19, 1967 E. L. RAGLAND III 3,343,002

INTEGRATED SOLID STATE SCANNING DEVICE

Filed Nov. 29, 1963 2 Sheets-Sheet ?

INVENTOR.
Evan L. Ragland III
BY Mueller & Aichele
Attys.

United States Patent Office 3,343,002

Patented Sept. 19, 1967

3,343,002
INTEGRATED SOLID STATE SCANNING DEVICE

Evan L. Ragland III, Glenview, Ill., assignor to Motorola, Inc., Chicago, Ill., a corporation of Illinois Filed Nov. 29, 1963, Ser. No. 326,761
24 Claims. (Cl. 307—88.5)

This invention relates generally to solid state switching devices and more particularly to large area PN junction arrangements which may be readily incorporated into a single crystal substrate of semiconductor material and subjected to crossed field biasing or modulation to perform desired switching, scanning and related functions.

The novel crossed-bias PN junction arrangements of this invention may be formed in a monolithic block of semiconductor material in specified configurations to provide solid state switching, computing, indicating, and control devices and solid state scanning devices capable of image display and image pickup.

Briefly, according to the present invention there is provided a thin wafer of semiconductor material having relatively large lateral dimensions. At least one modulating section comprising a number of layers of selected conductivity is formed in the semiconductor wafer. Large area continuous PN junctions are provided between adjacent layers of opposite conductivity material making up a modulating section.

Each modulating section contains at least one PN diode and a complementary pair including an NPN transistor and a PNP transistor. The diode and the transistors are isolated from one another by an ohmic layer of high resistivity intrinsic material. A number of such modulating sections may be provided in the semiconductor wafer, in cascade, with the base layers of the complementary pair of NPN and PNP transistors of each modulating section subjected to cross biasing or cross modulation to perform desired switching, scanning and related functions when incorporated with suitable output or utilization means.

Biasing potentials are applied laterally across the large dimension of the base layer of each transistor within a modulating section to establish an electric field transverse to the direction of current flow through the emitter and collector junctions of the transistors. Lateral current flow across the base layer produces a linear voltage gradient across the modulating section. The voltage gradient crosses a reference potential, and varying the voltage gradient with respect to the reference potential controls the bias and hence the conduction of specified incremental areas of the PN diode of the modulating section. Thus, current flow produced by an applied voltage transverse to the crossed-field bias established in the base layers of the transistors is restricted to a limited portion of the modulating section.

By incorporating two or more modulating sections having suitably poled and oriented voltage gradients into a semiconductor wafer, or by incorporating one or more modulated sections with a second reference or threshold voltage, it is possible to limit current flow to a line or an incremental area which may be moved or scanned laterally across the large dimensions of the wafer in response to variations of the voltage gradients with respect to a reference potential. This scanning operation in turn may be readily utilized to provide various switching, indicating, control and display functions when incorporated with suitable output means.

A better understanding of the invention may be had from the following description of exemplary embodiments, taken in conjunction with the accompanying drawings, in which.

Figures 1, 2, 3A, 3B, 4, 5A, 5B, 7, 8A, 8B:
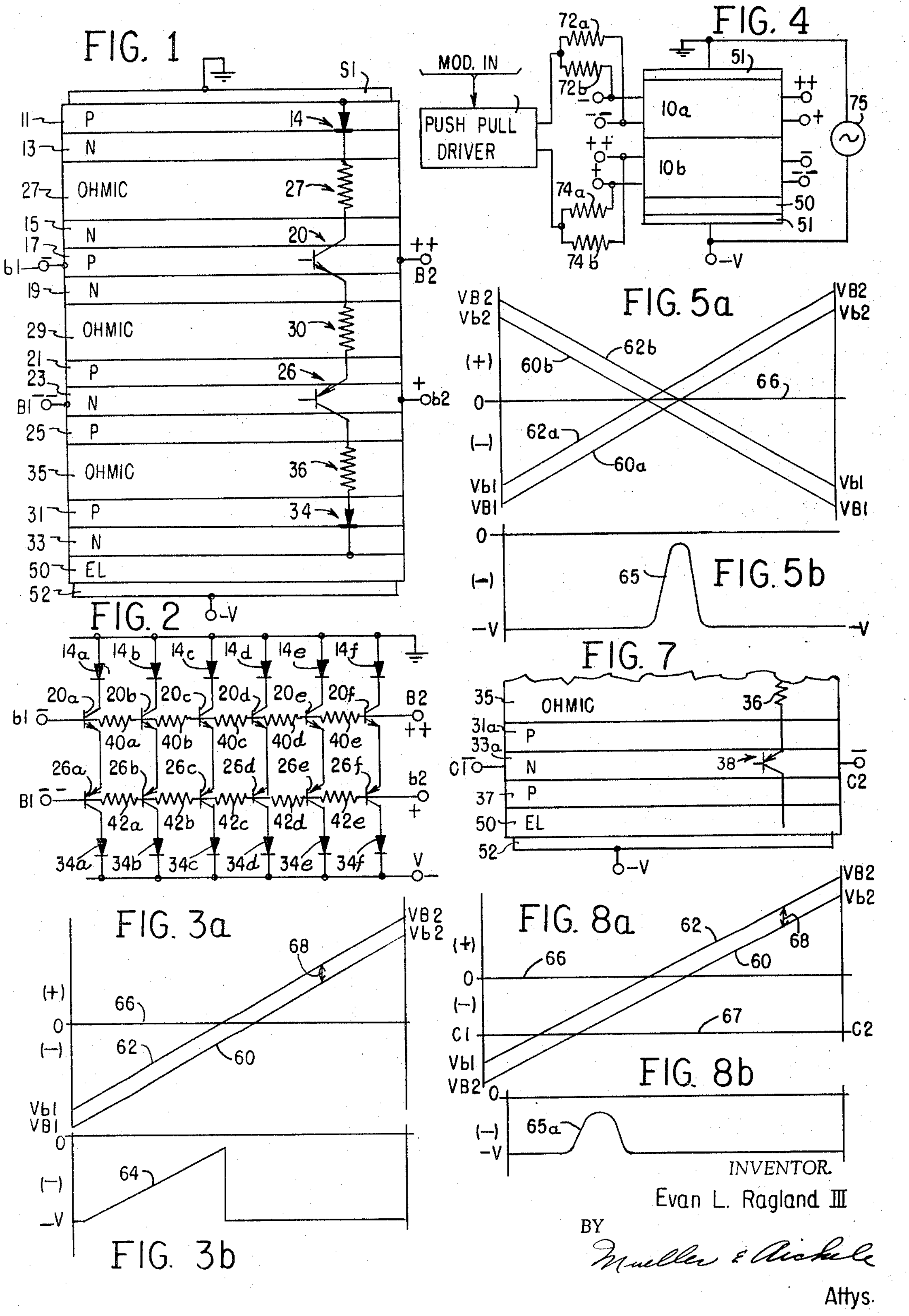
FIG. 1 is a side elevation, with schematic representations thereon, of a modulating section of the invention formed in a body of semiconductor material.
FIG. 2 is an equivalent circuit to illustrate incremental current paths in the modulating section of FIG. 1.
Figure 6:
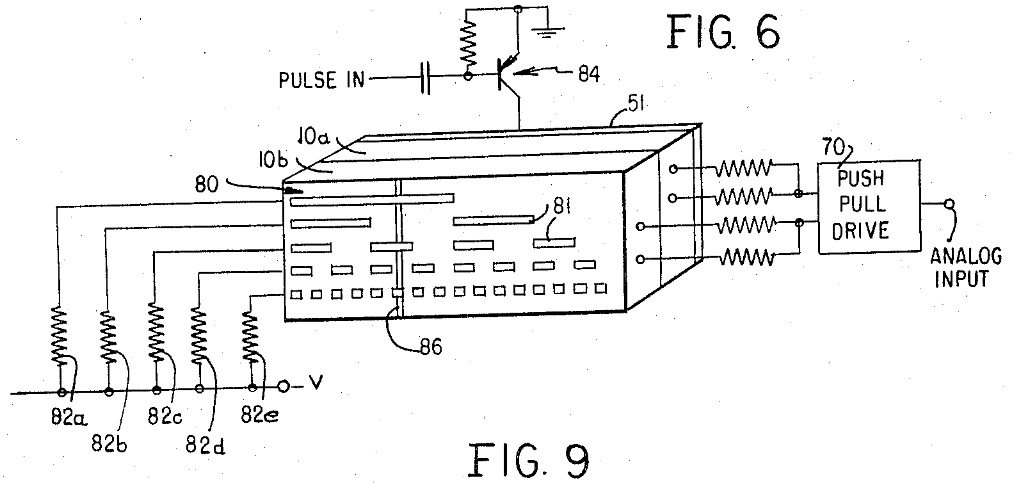
Figures 9, 10:
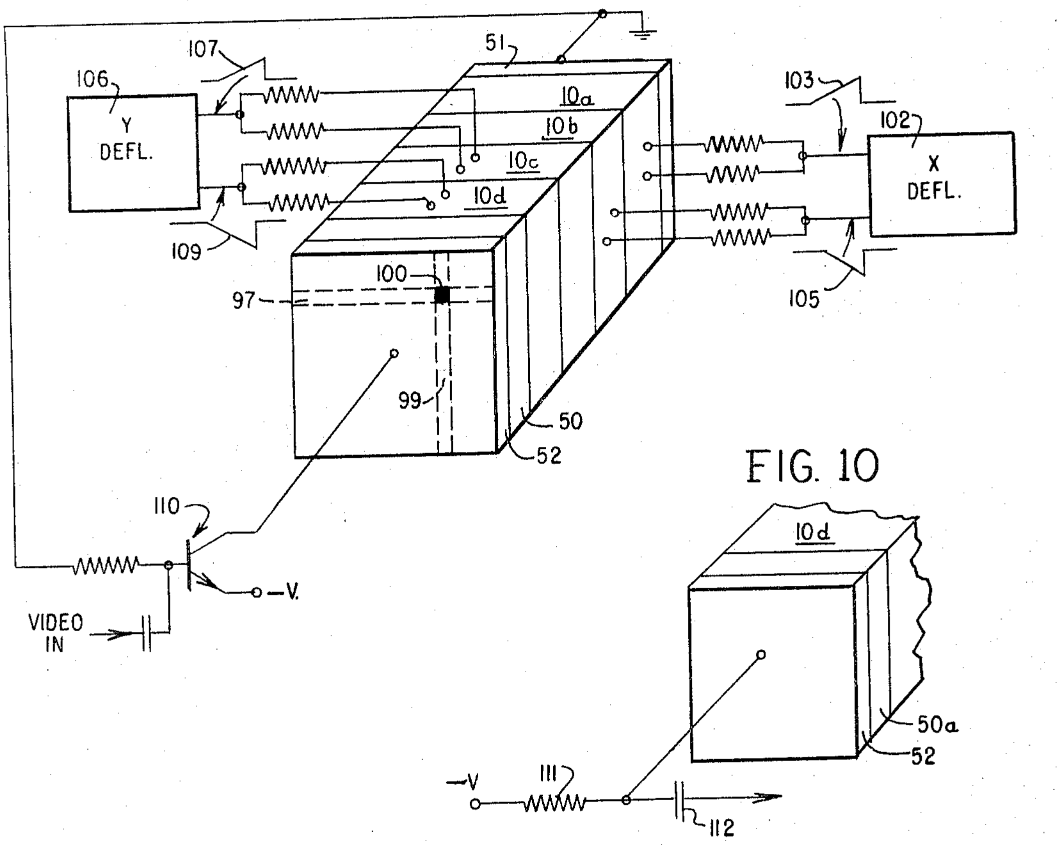

FIGS. 3*a* and 3*b* are potential diagrams useful in understanding the operation of the modulating section of FIG. 1;

FIG. 4 is a schematic representation of the use of two modulating sections to produce a line of incremental width for indication and display purposes;

FIGS. 5*a* and 5*b* are potential diagrams useful in understanding the operation of the apparatus of FIG. 4;

FIG. 6 is a schematic representation of the invention used as an analog-to-digital converter;

FIG. 7 is a side elevation illustrating the manner in which the modulating section of FIG. 1 may be combined with a threshold transistor in a body of semiconductor material;

FIGS. 8*a* and 8*b* are potential diagrams useful in understanding the operation of the device of FIG. 7;

FIG. 9 is a schematic representation of the invention used as a video display device; and FIG. 10 is a schematic representation of the invention used as a video pickup device.

Referring now to FIG. 1 there is shown a side view of a modulating section which may be subjected to crossed-field biasing to establish a variable voltage gradient according to the invention. Modulating section 10 includes a number of layers of selected P or N conductivity type formed in a substrate of semiconductor material. The semiconductor material may be a thin silicon wafer, in the order of .005–.010 inch thick, and having large lateral dimensions, for example, 1–1½ inches square. The thickness shown in FIG. 1 has been greatly exaggerated for purposes of illustration.

Each layer may be formed in modulating section 10 by vapor phase growth (epitaxial) or diffusion techniques. For example, suitably doped semiconductor material may be subjected to a temperature gradient decreasing from the substrate to the layer being grown, and gasses of the desired impurities passed over the semiconductor material by a baffle arrangement. Ohmic connections are made to the edges of selected layers for application of biasing potentials thereacross at terminals B1, B2, *b*1 and *b*2.

Each modulating section 10 contains a P anode layer 11 and an N cathode layer 13 to form junction diode 14 (illustrated schematically on modulating section 10). An N collective layer 15, P base layer 17 and N emitter layer 19 form NPN transistor 20, while P emitter 21, N base layer 23 and P collector layer 25 form PNP transistor 26. Ohmic layer 27 provides resistance 28 to isolate the cathode layer of diode 14 from the collector layer of transistor 20, while ohmic layer 29 provides resistance 30 to isolate the emitter layer of transistor 20 from the emitter layer of transistor 26. It is to be noted that in this arrangement NPN transistor 20 and PNP transistor 26 are connected as a complementary pair. Ohmic layers 27 and 29 may be of the intrinsic material of substrate used for the semiconductor wafer. An additional diode 34, comprising P anode layer 31 and N cathode layer 33 may also be provided and isolated from the collector layer of transistor 26 by resistance 36 of ohmic layer 35.

FIG. 2 is an equivalent circuit representing a finite number of incremental sections disposed laterally across modulating section 10. It is to be understood that in an actual device the number of incremental sections is infinite and the lateral resistance joining the bases of the incremental transistors is incremental. The ohmic layers separating diodes 14 and transistors 20 and 26 have been omitted from FIG. 2 for clarity of illustration.

In FIG. 2 diodes 14*a*–14*f* represent incremental diodes that make up diode 14, while transistors 20*a*–20*f* and 26a-26f represent incremental transistors that make up transistors 20 and 26 respectively. Resistors 40a–40e and 42a–42e, joining the bases of incremental transistors 20a–20f and 26a–26f, represent elements of resistance taken laterally across base layers 17 and 23 of modulating section 10 of FIG. 1. It can be seen that biasing potentials of the polarities indicated applied laterally across each base layer by terminals B1, B2, b1 and b2, and further providing a fixed bias between the base layers so that the base-emitter junction of each incremental transistor is maintained conducting, will produce a linear voltage gradient laterally across base layers 17 and 23 of modulation section 10. This is so because lateral current flow across each base layer is returned through the forward biased base-emitter junction of each incremental transistor and through incremental diodes 34a–34f to produce voltage drops across incremental resistances 40a–40e and 42a–42e that vary laterally across each base layer.

To provide cross-bias switching of incremental sections or areas of modulation section 10, the biasing potentials applied to base layers 17 and 23 at terminals B1, B2, b1 and b2 are selected so that a constant forward biasing voltage is maintained between each base layer, and so that the voltage gradient across each base layer crosses a reference potential such as zero or ground reference potential. Thus, the polarity and magnitude of the potential difference between each base layer is such that the emitter-base junctions of NPN transistors 20 and PNP transistor 26 are forward biased and each transistor is normally conducting. In addition, the absolute magnitude of the potentials applied to opposite lateral edges of base layers 17 and 23 is of the opposite polarity with respect to zero or ground reference potential. Thus, the voltage gradient established laterally across each base layer extends from a negative value to a positive value and crosses the reference potential at some intermediate point within the base layers. To complete the circuit an operating voltage is applied between anode layer 11 of diode 14 and cathode layer 33 of diode 34 (or alternately collector layer 25 of PNP transistor 26) by suitable electrode means or equipotential surfaces each as electrodes 51 and 52. Electrode 51 is returned to a reference potential such as ground reference potential, and the polarity of the operating potential applied to electrode 52 is such to cause current flow through selected portions of modulating section 10 in response to variations in the voltage gradients established across base layers 17 and 23.

Operation of the above-described modulating section can be best understood with reference to potential diagrams of FIGS. 3a and 3b, wherein curves 60 and 62 represent the voltage gradients across base layers 17 and 23 of NPN transistor 20 and PNP transistor 26, respectively, and curve 64 represents the voltage appearing at cathode layer 33 of diode 34 (or alternately at collector layer 25 of PNP transistor 26). Reference level 66, such as zero reference, is established by connecting electrode 51 and hence base layer 11 of diode 14 to ground reference potential. The fixed potential difference between voltage gradients 60 and 62 (as indicated by reference numeral 68), maintains forward emitter-base bias for both NPN transistor 20 and PNP transistor 26 so that they are normally conducting. Cathode layer 33 of diode 34 is returned to a negative voltage via electrode 52 so that it is forward biased and conducting.

Incremental areas of diode 14 coextensive with segments of voltage gradients 60 and 62 that are negative with respect to reference potential 66 (or those incremental diodes appearing to the left of the area at which the voltage gradients 60 and 62 cross reference potential 66) are forward biased and hence conducting. Incremental areas of diode 14 coextensive with segments of voltage gradients 60 and 62 that are positive with respect to reference potential 66 (or those incremental diodes appearing to the right of the area at which voltage gradients 60 and 62 cross reference potential 66) are reversed biased and hence non-conducting.

As can be seen from curve 64 of FIG. 3b, the conduction and hence the current density through modulating section 10 varies linearly in a lateral direction, with peak conduction occurring just prior to the point of sharp cutoff occurring as voltage gradients 60 and 62 cross reference level 66. Thus, by varying the magnitude of one end of voltage gradients 60 and 62 with respect to reference potential 66, such as may be achieved by superimposing a modulating or sweep signal on the biasing potentials applied to terminals B1, b1 or B2, b2, the point of maximum conduction can be swept laterally across modulating section 10.

This variable area of maximum conduction through modulating section 10 may be utilized to perform switching, display and indicating functions when incorporated with output means and with a modulating signal superimposed on the biasing potentials supplied to base layers 17 and 23. For example, as further shown in FIG. 1 a coating of electroluminescent phosphor 50, in conjunction with a transparent electrode 52, may be applied to cathode layer 33 of diode 34. Electroluminescent phosphor 50 may contain light emitting material such as zinc sulphite in a suitable frit or binder such as ground glass. Such material emits light in proportion to an alternating current applied thereto, which alternating current may be superimposed by an input circuit on the operating voltage applied across modulating section 10 between electrodes 51 and 52. Electrode 52 may consist of a transparent layer of tin oxide deposited on a glass sheet to provide a visual display of light emitted by electroluminescent phosphor 50.

To limit conduction between electrodes 51 and 52 to a line of incremental width, two modulating sections 10a and 10b may be formed contiguous with one another, in the semiconductor substrate as shown in FIG. 4. In this instance, anode and cathode layers 31 and 33 of diode 34 of modulating section 10a may be combined with anode and cathode layers 11 and 13 of diode 14 of modulating section 10b. Electroluminescent layer 50 and transparent electrode 52 are applied to the modulating section 10b, and a reference potential and the operating voltage are applied to the entire combination of modulating sections 10a and 10b by connecting electrode 51 to ground reference potential and electrode 52 to a negative voltage.

The biasing potentials applied to base layers 17 and 23 of second modulating section 10b are reversed in polarity with respect to those applied to modulating section 10a. The relative magnitude with respect to each other, and with respect to the reference potential, remains the same. A push-pull driver 70 may be utilized to vary or modulate the voltage gradients appearing across the base layers of modulating sections 10a and 10b by connection to terminals B1, b1, or B2, b2 of each modulating section via isolating resistors 72a, 72b, and 74a, 74b. This arrangement provides a modulating signal which is 180° out-of-phase for each of modulating sections 10a and 10b. An AC source 76 is superimposed on the DC operating voltage applied across modulating sections 10a and 10b to provide an alternating current component to illuminate electroluminescent layer 50.

The resulting potential diagrams showing the voltage gradients across the base layers of the transistors of each modulating section, and the current distribution through the modulating sections, is shown in FIGS. 5a and 5b. It can be seen that the voltage gradients 60a and 62a across modulating section 10a, and voltage gradients 60b and 62b across modulating section 10b, have reverse slopes. Under these conditions of cross-biasing the area of maximum conduction between electrodes 51 and 52 occurs when an incremental area of diode 14 of both modulating sections 10a and 10b is forward biased, and limited to an area where voltage gradients of both slopes cross reference potential 66 concurrently. The voltage appearing at cathode layer 33 of diode 34 for modulating section 10*b* is shown by curve 65, and illustrates that the area of conduction is confined on both sides for a given lateral direction. Varying the biasing potentials applied to both modulating sections 10*a* and 10*b*, as may be achieved by supplying a modulating signal to push-pull driver 70, will cause the area of maximum conduction illustrated by curve 65 to be positioned or moved laterally depending on the nature of the modulating signal. The spatial position of a luminant line on electroluminescent layer 50 provides an indication or display in response to the modulating signal applied to push-pull driver 70.

FIG. 6 illustrates the manner in which the invention may be employed as an analog-to-digital converter. In the example illustrated, electroluminescent phosphor 50 and transparent electrode 52 of modulating section 10*b* are replaced by the electrode array shown generally at 80. This array includes several rows of discrete conductive elements 81. It is to be noted that the length of each conductive element 81 varies for each row such that the entire conductive array may be encoded with a binary or similar code by the lengths of the conductive elements in each row. All of the conductive elements in each row are returned to an operating voltage through resistors 82*a*–82*e*, respectively. An analog voltage is supplied to push-pull driver 70 to modulate the cross-biasing applied to the base layers of modulating sections 10*a* and 10*b* in the manner discussed in conjunction with FIG. 4. For simplicity of illustration, fixed DC biasing potentials for modulating sections 10*a* and 10*b* are not shown in detail in FIG. 6. Electrode 51 of modulating section 10*a* is returned to ground reference potential through a switching device such as transistor 84. A pulse applied to transistor 84 switches it on to create a line of current (illustrated by shaded area 86) through modulating sections 10*a* and 10*b*. Current line 86 is positioned laterally along electrode array 80 in response to an analog signal applied to the input of push-pull driver 70. When transistor 84 is pulsed, current line 86 intercepts selected conductive elements 81 to produce an output pulse across corresponding ones of resistors 82*a*–82*e*. The combination of pulses developed across resistors 82*a*–82*e* provide a digital representation of the analog input supplied to push-pull driver 70.

In addition to the use of two modulating sections 10*a* and 10*b* in the manner shown in FIG. 4 to provide a single line of current conduction, a single modulating section 10 of the type shown in FIG. 1 may be combined with a variable threshold voltage to provide an area of current conduction restricted in one lateral direction. The threshold voltage may be provided by a suitably biased PNP switching transistor formed in the modulating section between diode 34 and electrode 52. Preferably, as shown in FIG. 7, the collector-base junction of the PNP switching may incorporate diode 34, and be provided by P layer 31*a* and N layer 33*a*. An additional P layer 37 is added to N layer 33*a* to form the PNP transistor illustrated schematically at 38. Electroluminescent material 50 and electrode 52 are formed on P layer 37 to provide means for visual display in the manner previously discussed. Alternately, other output or utilization means may be substituted for electroluminescent layer 50 and electrode 52. A negative biasing potential is applied to terminals C1 and C2 of base layer 33*a* so that PNP transistor 38 is normally cutoff. It is to be noted that in distinction with the voltage gradient set up in base layers 17 and 23 of modulating section 10, the biasing potential applied to both edges of base layer 33*a* are of the same potential so that an approximate equipotential surface is maintained throughout the base layer 33*a*.

With reference to FIGS. 8*a* and 8*b*, biasing potentials are applied to base layers 17 and 23 to provide voltage gradients 60 and 62 and a reference potential 66 in the manner previously discussed. A second variable reference for threshold voltage level 67 is established by the bias applied to base layer 33*a* of PNP transistor 38. Threshold voltage level 67 is selected so that it is crossed by voltage gradients 60 and 62. In operation, incremental areas of diode 14 are either conductive or cutoff by voltage gradients 60 and 62 crossing reference potential 66, as discussed in conjunction with modulating section 10 of FIG. 1. However, as long as incremental areas of transistor 38 are maintained cutoff by threshold voltage 67, there is no current flow. Incremental areas of transistor 38 will conduct only as voltage gradients 60 and 62 further cross reference threshold voltage 67. There is conduction only through the incremental areas of the modulating section lying between the crossings of reference voltage 66 and threshold voltage 67. The resulting conduction is illustrated by curve 65*a* of FIG. 8*b*. By varying the biasing potentials and thus the voltage gradients applied across base layers 17 and 23 with respect to threshold biasing level 67 as well as with respect to reference level 66, the area of maximum conduction to the modulating section can be limited on both sides and moved laterally across modulating section 10 in one direction as illustrated in curve 65*a* of FIG. 8*b*.

FIG. 9 illustrates the manner in which four modulating sections 10*a*–10*b* may be combined to limit an incremental area of conduction bi-directionally to provide a video display capable of being scanned in both the X and Y directions. Modulating sections 10*a*–10*d*, each substantially similar to section 10 shown in FIG. 1, are formed continuously in the semiconductor substrate. Electrode 51 is formed on P layer 11 of diode 14 of modulating section 10*a*, while electroluminescent layer 50 and electrode 52 are formed on N layer 33 of diode 34 of modulating section 10*d*. Additional diodes 14 and 34, common to consecutive layers between electrodes 51 and 52, may be incorporated into single P and N layers. DC biasing for each pair of modulation sections 10*a*, 10*b* and 10*c*, 10*d* (not shown for simplicity of illustration) is the same as shown in FIG. 4 and accordingly the voltage gradients 60*a*, 62*a*, 60*b* and 62*b* and reference potential 66 of FIG. 5*a* are established to provide a single line of conduction movable laterally across each pair in either the X or Y direction. The biasing potentials applied to modulating sections 10*a* and 10*b* also are quadralaterally related to those applied to modulating sections 10*c* and 10*d*. Thus, the line of current produced by modulating sections 10*a* and 10*b* is at right angles to that produced by modulating sections 10*c* and 10*d*. This is illustrated by current lines 97 and 99, respectively, shown in dotted lines on electrode 52. Conduction between electrodes 51 and 52 occurs only at point of intersection 100 between current lines 97 and 99. This incremental area of current in turn produces a small spot of lumination on electroluminescent layer 50 to be emitted through transparent electrode 52.

It is apparent that by concurrently causing current lines 97 and 99 to scan across electroluminescent layer 50, the spot produced thereon can be moved in a desired pattern in both the X and Y directions. To this end, X deflection sytem 102 supplies sweep sawtooth waves 103 and 105 to modulating sections 10*a* and 10*b*, respectively. At the same time Y deflection sytem 106 applies sawtooth sweep waves 107 and 109 to modulating sections 10*c* and 10*d*, respectively. The X deflection system 102 has a push-pull output so that horizontal sweep waves 103 and 105 are maintained in 180° phase relationship. Similarly, Y deflection system 106 maintains Y deflection waves 107 and 109 in 180° phase relationship. This arrangement causes concurrent sweep of current lines 97 and 99 in the X and Y directions. The repetition rates of X deflection system 102 and Y deflection system 106 may be selected and synchronized so that the spot produced by incremental current area 100 is scanned to provide a raster of the type commonly used in television image reproduction.

The intensity or Z modulation of the spot produced by the incremental current area 100 is provided by transistor 110, coupled between transparent electrode 52 and an operating potential. A video signal supplied to the base electrode of transistor 110 modulates conduction between electrodes 51 and 52, a video image is formed on electroluminescent layer 50 which may be viewed through transparent electrode 52.

The apparatus shown in FIG. 9 may also be utilized as a video pickup device by replacing electroluminescent layer 50 with a layer of photoconductive material 50*a*, as shown in FIG. 10. In this instance biasing and sweep voltages for modulating sections 10*a*–10*d* are applied in a manner similar to that illustrated in FIG. 9. An image projected through transparent electrode 52 onto photoconductive layer 50*a* causes variations in conductivity representative of the image. Scanning by incremental current area 100 develops an AC or video signal across resistor 111 in response to such variations. This video signal in turn may be coupled by capacitor 112 to a high impedance input stage of a video amplifier.

It will be understood that the several embodiments described are exemplary, and that numerous additional useful applications and variations of the novel crossed-field modulated semiconductor device and the underlying principles herein disclosed are possible by those skilled in the art.

What is claimed is:

1. A solid state electrical device including a plurality of substantially flat parallel layers of P and N conductivity type semiconductor material, said layers forming a junction diode and first and second junction transistors consecutively, said first and second transistors being complementary types and each having at least a base layer, there being layers of ohmic material separating said diode and said transistors from one another, circuit means for applying a biasing potential laterally across the base layer of each said transistor, and circuit means for varying said biasing potential with respect to a reference potential.

2. A solid state electrical device including a plurality of substantially flat parallel layers of P and N conductivity type semiconductor material, said layers forming a PN junction diode, an NPN transistor and a PNP transistor consecutively, said transistors each having emitter, collector and base layers, there being a layer of ohmic material separting said PN junction diode and said transistors from one another, circuit means to cause current flow across incremental areas of said PN junction diode when forward biased, and circuit means for establishing a voltage gradient laterally across the base layers of said transistors, said voltage gradients adapted to cross a reference potential to thereby provide forward biasing for incremental areas of said PN junction diode, whereby varying said voltage gradients with respect to said reference potential varies the incremental area of conduction within said semiconductor material.

3. A solid state electrical device including a plurality of substantially flat parallel layers of P and N conductivity type semiconductor material, said layers forming a PN junction diode, an NPN transistor and a PNP transistor consecutively, said transistors each having a base layer, there being a layer of ohmic material separating said PN junction diode and said transistors from one another, circuit means to cause current flow across incremental areas of said PN junction diode when forward biased, and circuit means for applying first and second biasing voltages laterally acros the base layers of said transistors, said biasing voltages biasing said transistors conductive, and said biasing voltages establishing voltage gradient laterally across the base layers of said transistors, said voltage gradient adapted to cross a reference potential to thereby provide forward bias for incremental areas of said PN junction diode, whereby varying said voltage gradient with respect to said reference voltage varies the incremental area of conduction within said semiconductor material.

4. A solid state electrical device including a plurality of substantially flat parallel layers of P and N conductivity type semiconductor material, said layers forming a PN junction diode, an NPN transistor and a PNP transistor consecutively, said diode having anode and cathode layers, said transistors each having emitter, collector and base layers, there being a layer of ohmic material separating said diode and said transistors from one another, first circuit means for applying an operating voltage between the anode layer of said diode and the collector layer of said PNP transistor, with the anode layer of said diode being connected to a reference potential, said first circuit means causing current flow across the PN junction of said diode when forward biased, and second circuit means for applying first and second biasing voltages laterally across the base layers of each said transistor, said biasing voltages having a polarity and magnitude with respect to one another to bias said transistors into conduction, and said biasing voltages establishing a voltage gradient laterally across the base layer of each said transistor, said voltage gradients crossing said reference potential to thereby forward bias incremental areas of said PN junction diode, whereby varying said voltage gradient with respect to said reference voltage varies the incremental area of said diode which is forward biased.

5. A solid state electrical device including a plurality of substantially flat parallel layers of P and N conductivity type semiconductor material, said layers forming a junction diode and first, second and third transistors consecutively, said first and second transistors being of complementary types, each said transistor having at least a base layer, there being a layer of ohmic material separating said diode and said transistors from one another, circuit means for applying a biasing potential laterally across the base layer of said first and second transistors, circuit means for varying said biasing potential with respect to a reference potential, and circuit means for applying a threshold bias to the base layer of said third transistor.

6. A solid state electrical device including a plurality of substantially flat parallel layers of P and N conductivity type semiconductor material, said layers forming a PN junction diode, an NPN transistor, and first and second PNP transistors consecutively, said transistors each having emitter, collector and base layers, there being a layer of ohmic material separating said PN junction diode and said transistors from one another, circuit means to cause current flow across incremental areas of said PN junction diode when forward biased, circuit means for establishing a voltage gradient laterally across the base layers of said first and second transistors, said voltage gradient adapted to cross a reference potential to thereby provide forward biasing for incremental areas of said PN junction diode, and circuit means for applying a threshold bias to the base layer of said third transistor, whereby varying said voltage gradients with respect to said reference potential and said threshold varies the incremental area of conduction within said semiconductor material.

7. A solid state electrical device including a plurality of substantially flat parallel layers of P and N conductivity type semiconductor material, said layers forming a PN junction diode, an NPN transistor, and first and second PNP transistors consecutively, said transistors each having a base layer, there being a layer of ohmic material separating said PN junction diode and said transistors from one another, circuit means to cause current flow across incremental areas of said PN junction diode when forward biased, circuit means for applying first and second biasing voltages laterally across the base layers of said NPN transistor and said first PNP transistor, said biasing voltages biasing said NPN transistor and said first PNP transistor conductive, and said biasing voltages establishing a voltage gradient laterally across the base layers of said NPN and said first PNP transistor, said voltage gradient adapted to cross a reference potential to thereby provide forward bias for incremental areas of said PN junction diode, and circuit means for applying a threshold bias to said second PNP transistor, whereby varying said voltage gradient varies the incremental area of conduction within said semiconductor material.

8. A solid state electrical device including a plurality of substantially flat parallel layers of P and N conductivity type semiconductor material, said layers forming a PN junction diode, an NPN transistor, and a pair of PNP transistors consecutively, said diode having anode and cathode layers, said transistors each having emitter, collector and base layers, there being a layer of ohmic material separating said diode and said transistors from one another, first circuit means for applying an operating voltage between the anode layer of said diode and the emitter layer of said second PNP transistor, with the anode layer of said diode connected to a reference potential, said first circuit means causing current flow across the PN junction of said diode when forward biased, second circuit means for applying first and second biasing voltages laterally across the base layers of said NPN transistor and said first PNP transistor, said biasing voltages having a polarity in magnitude with respect to one another to bias said NPN transistor and said first PNP tranistsor into conduction, said biasing voltages further establishing voltage gradients laterally across the base layers of said NPN transistor and said first PNP transistor, said voltage gradients adapted to cross said reference potential to thereby forward bias incremental areas of said PN junction diode, and third circuit means for applying a threshold bias to the base layer of said third transistor, whereby varying said voltage gradients with respect to said reference potential and said threshold bias varies the forward bias for incremental areas of said PN junction diode to vary the area of current conduction to said semiconductor material.

9. Electrical apparatus including a body of semiconductor material having first and second substantially flat parallel major surfaces, with the lateral dimensions of said major surfaces large with respect to the spacing therebetween, there being at least one modulating section formed in said body of semiconductor material, said modulating section including a plurality of flat parallel layers of P and N conductivity type material forming a junction diode and a complementary pair of transistors consecutively, each said transistor having collector, emitter and base layers, there being layers of ohmic material separating said junction diode and said transistors, terminal means attached to two opposite edges of the base layer of each said transistor, electrode means attached to said first and second major surfaces, circuit means including input means for applying an operating voltage between said electrode means, circuit means including control means for applying biasing voltages to said terminal means, said biasing voltages establishing voltage gradients laterally across said base layers, said voltage gradients adapted to cross a reference potential to forward bias incremental areas of said junction diode to cause current flow between said electrode means, said current flow being confined to a path coextensive with forward biased incremental areas of said junction diode, with said control means adapted to vary said incremental area of current flow laterally across said semiconductor material, an output means coupled to one said electrode and responsive to said current flow.

10. The apparatus of claim 9 including a layer of electroluminescent material disposed between one said major surface of said body of semiconductor material and one said electrode means.

11. The apparatus of claim 9 including a layer of photoconductive material disposed between one said major surface of said body of semiconductor material and one said electrode means, and said output means includes circuit means providing signals in response to variations of said current flow resulting from variations in conductivity of said photoconductive material.

12. The apparatus of claim 9 wherein said body of semiconductor material has a second modulating section formed therein continuous with said one modulating section, and having second circuit means including control means for applying biasing voltages to the terminal means on the base layers of the transistors thereof, said biasing voltages applied to said modulating sections with opposite polarity to thereby confine said current flow to a line of incremental width, and with said control means including sweep means for causing said line of current flow to scan laterally across said body of semiconductor material.

13. The apparatus of claim 12 wherein one said electrode means is segmented to provide a coded format, and said output means includes circuit means to provide signals in response to current flow to selected segments of said one electrode means.

14. The apparatus of claim 12 including a layer of electroluminescent material disposed between one said major surface of said body of semiconductor material and one said electrode means.

15. The apparatus of claim 12 including a layer of photoconductive material disposed between one said major surface of said body of semiconductor material and one said electrode means, and said output means includes circuit means providing signals in response to variations of said current flow resulting from variations in conductivity of said photoconductive material.

16. The apparatus of claim 12 wherein said body of semiconductor material has two additional modulating sections formed continuously therein, and with two additional circuit means including control means for applying biasing voltages to the terminal means to the base layers of the transistors thereof, said additional biasing voltages having the same relative polarities as applied to said first two modulating sections, and with said terminal means attached to the base layers of the transistors of said two additional modulating sections disposed orthogonal to the terminal means attacched to the base layers of the transistors of the first two said modulating sections to thereby confine said current flow to an incremental area small with respect to the lateral dimensions of said body of semiconductor material, and with said control means including sweep means for causing said incremental area of current flow to be scanned bi-directionally across the lateral dimensions of said body of semiconductor material.

17. The apparatus of claim 16 including a layer of electroluminescent material disposed between one said major surface of said body of semiconductor material and one said electrode means.

18. The apparatus of claim 16 including a layer of photoconductive material disposed between one said major surface of said body of semiconductor material and one said electrode means, and said output means includes circuit means providing signals in response to variations of said current flow resulting from variations in conductivity of said photoconductive material.

19. The apparatus of claim 17 wherein said input means includes means for applying a video signal to said body of semiconductor material to produce an image on said electroluminescent material in response thereto as said incremental area of current flow is scanned bi-directionally.

20. The apparatus of claim 9 wherein said body of semiconductor material includes a switching transistor having emitter, collector, and base layers continuous with said modulating section, and including further circuit means for establishing a threshold bias for said switching transistor.

21. A semiconductor device including in combination, a body of semiconductor material having first and second substantially flat parallel major surfaces, with the lateral dimensions of said major surfaces large with respect to the spacing therebetween, a plurality of substantially flat parallel layers of P and N conductivity type material forming a junction diode and first and second transistors consecutively in said body of semiconductor material, said transistors being complementary types and each having a base layer, there being layers of ohmic material separating said diode and said transistors from one another, electrode means attached to said first and second major surfaces, and terminal means attached to opposite edges of the base layer of each said transistor.

22. A semiconductor device including in combination, a body of semiconductor material having first and second substantially flat parallel major surfaces, with the lateral dimensions of said major surfaces being large with respect to the spacing therebetween, a plurality of substantially flat parallel layers of P and N conductivity type material forming a PN junction diode, an NPN transistor, and a PNP transistor consecutively in said body of semiconductor material, there being layers of ohmic material separating said diode and said transistors from one another, electrode means attached to said first and second major surfaces, and terminal means attached to opposite edges of the base layer of each said transistor.

23. A semiconductor device including in combination, a body of semiconductor material having first and second substantially flat parallel major surfaces, with the lateral dimensions of said major surfaces large with respect to the spacing therebetween, a plurality of substantially flat parallel layers of P and N conductivity type material forming a junction diode and first, second and third transistors consecutively in said body of semiconductor material, said first and second transistors being complementary types, each said transistor having a base layer, there being layers of ohmic material separating said diode and said transistors from one another, electrode means attached to said first and second major surfaces, terminal means attached to opposite edges of the base layers of said first and second transistors, and terminal means attached to the base layer of said third transistor.

24. A semiconductor device including in combination, a body of semiconductor material having first and second substantially flat parallel major surfaces, with the lateral dimensions of said major surfaces large with respect to the spacing therebetween, a plurality of substantially flat parallel layers of P and N conductivity type material forming a PN junction diode, an NPN transistor and first and second PNP transistors consecutively in said body of semiconductor material, each said transistor having emitter, collector and base layers, there being layers of ohmic material separating said diode and said transistors from one another, electrode means attached to said first and second major surfaces, terminal means attached to opposite edges of the base layers of said NPN transistor and said first PNP transistor, and terminal means attached to the base layer of said second PNP transistor.

References Cited

UNITED STATES PATENTS 3,254,267 5/1966 Sack ............... 313—108

ARTHUR GAUSS, *Primary Examiner.*

ROBERT H. PLOTKIN, *Assistant Examiner.*